(12) United States Patent
Kurosawa

(10) Patent No.: US 7,981,792 B2
(45) Date of Patent: Jul. 19, 2011

(54) SEMICONDUCTOR DEVICE AND METHOD OF MANUFACTURING THE SAME, CIRCUIT BOARD, AND ELECTRONIC INSTRUMENT

(75) Inventor: Yasunori Kurosawa, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 495 days.

(21) Appl. No.: 11/695,525

(22) Filed: Apr. 2, 2007

(65) Prior Publication Data

US 2007/0170566 A1    Jul. 26, 2007

Related U.S. Application Data

(62) Division of application No. 10/880,352, filed on Jun. 29, 2004, now Pat. No. 7,218,008.

(30) Foreign Application Priority Data

Jun. 30, 2003    (JP) .................................. 2003-187455

(51) Int. Cl.
*H01L 21/4763*    (2006.01)
(52) U.S. Cl. ................. 438/642; 438/643; 257/E21.582; 257/E21.584
(58) Field of Classification Search .................. 438/642, 438/643, 644; 257/E21.575, E21.582, E21.584
See application file for complete search history.

(56) References Cited

U.S. PATENT DOCUMENTS

| | | | | |
|---|---|---|---|---|
| 5,593,903 A * | 1/1997 | Beckenbaugh et al. | ......... | 438/18 |
| 5,656,858 A | 8/1997 | Kondo et al. | .................. | 257/737 |
| 5,757,078 A | 5/1998 | Matsuda et al. | .............. | 257/737 |
| 5,795,819 A * | 8/1998 | Motsiff et al. | ................. | 438/618 |
| 5,874,782 A | 2/1999 | Palagonia | ...................... | 257/778 |
| 5,920,794 A * | 7/1999 | Hong | ............................. | 438/643 |
| 5,937,320 A * | 8/1999 | Andricacos et al. | .......... | 438/614 |
| 6,181,010 B1 | 1/2001 | Nozawa | ........................ | 257/737 |
| 6,181,569 B1 | 1/2001 | Chakravorty | ................. | 361/761 |
| 6,229,221 B1 | 5/2001 | Kloen et al. | ................... | 257/784 |
| 6,255,737 B1 | 7/2001 | Hashimoto | .................... | 257/784 |
| 6,465,886 B1 * | 10/2002 | Horiuchi et al. | .............. | 257/738 |
| 6,555,459 B1 | 4/2003 | Tokushige et al. | ........... | 438/612 |
| 6,586,275 B2 | 7/2003 | Kim et al. | ..................... | 438/106 |
| 6,621,154 B1 | 9/2003 | Satoh et al. | ................... | 257/684 |
| 6,790,759 B1 | 9/2004 | Wang et al. | ................... | 438/612 |
| 6,841,875 B2 | 1/2005 | Ohsumi | ....................... | 257/738 |
| 6,909,054 B2 | 6/2005 | Sakamoto et al. | | |
| 6,943,101 B2 * | 9/2005 | Brintzinger | ................... | 438/643 |
| 7,160,121 B2 * | 1/2007 | Van Schuylenbergh et al. | .............................. | 439/81 |
| 7,482,268 B2 * | 1/2009 | Lin et al. | ....................... | 438/642 |
| 2002/0070440 A1 | 6/2002 | Aiba et al. | .................... | 257/690 |

FOREIGN PATENT DOCUMENTS

| | | |
|---|---|---|
| JP | 55-074159 | 6/1980 |
| JP | 01-161735 | 6/1989 |
| JP | 11-008250 | 1/1999 |
| JP | 2000-114299 | 4/2000 |
| JP | 2001093932 A | 4/2001 |
| JP | 2001352174 A | 12/2001 |
| JP | 2002-237546 | 8/2002 |

* cited by examiner

*Primary Examiner* — Matthew C Landau
*Assistant Examiner* — Sun M Kim
(74) *Attorney, Agent, or Firm* — DLA Piper LLP (US)

(57) ABSTRACT

A semiconductor device includes: a semiconductor substrate in which an integrated circuit is formed; an interconnect layer which includes a linear section and a land section connected with the linear section; and an underlayer disposed under the interconnect layer, and the land section includes a first section which is in contact with the underlayer, and a second section which is not in contact with the underlayer.

12 Claims, 11 Drawing Sheets

SEMICONDUCTOR DEVICE AND METHOD OF MANUFACTURING THE SAME, CIRCUIT BOARD, AND ELECTRONIC INSTRUMENT

CROSS-REFERENCE TO THE RELATED APPLICATIONS

This is a divisional of application Ser. No. 10/880,352 filed Jun. 29, 2004, the entire contents of which are incorporated by reference. This application also claims benefit of priority under 35 U.S.C. §119 to Japanese Patent Application No. 2003-187455, filed on Jun. 30, 2003, is hereby incorporated by reference in its entirety.

BACKGROUND OF THE INVENTION

The present invention relates to a semiconductor device and a method of manufacturing the same, a circuit board, and an electronic instrument.

In the case where a semiconductor device is mounted face-down on a substrate, it is important to reduce stress applied to an external terminal formed of solder or the like. A structure in which an external terminal is formed on a stress relief layer (resin layer) has been conventionally applied. However, there may be a case where a sufficient effect cannot be obtained. In particular, improvement of reliability has been demanded for a wafer level chip size/scale package (CSP), in which packaging is performed in wafer units.

BRIEF SUMMARY OF THE INVENTION

A semiconductor device according a first aspect of the present invention includes:

a semiconductor chip in which an integrated circuit is formed;

a substrate on which the semiconductor chip is mounted;

an interconnect layer which includes a linear section and a land section connected with the linear section; and an underlayer disposed under the interconnect layer, wherein the land section includes a first section which is in contact with the underlayer, and a second section which is not in contact with the underlayer.

A semiconductor device according to a second aspect of the present invention includes:

a semiconductor substrate in which an integrated circuit is formed;

an interconnect layer which includes a linear section and a land section connected with the linear section; and an underlayer disposed under the interconnect layer, wherein the land section includes a first section which is in contact with the underlayer; and a second section which is not in contact with the underlayer.

A circuit board according to a third aspect of the present invention has one of the above semiconductor devices mounted thereon.

An electronic instrument according to a fourth aspect of the present invention has one of the above semiconductor devices.

A method of manufacturing a semiconductor device according to a fifth aspect of the present invention includes:

(a) forming a conductive layer over a substrate;

(b) forming an interconnect layer which includes a linear section and a land section connected with the linear section so that the conductive layer is disposed under at least the land section;

(c) forming an underlayer by over-etching the conductive layer to be included inward a region of the land section; and (d) mounting a semiconductor chip on the substrate, an integrated circuit being formed in the semiconductor chip, wherein the land section includes a first section which is in contact with the underlayer, and a second section which is not in contact with the underlayer.

A method of manufacturing a semiconductor device according to a sixth aspect of the present invention includes:

(a) forming a conductive layer over a semiconductor substrate in which an integrated circuit is formed;

(b) forming an interconnect layer which includes a linear section and a land section connected with the linear section so that the conductive layer is disposed under at least the land section;

(c) forming an underlayer by over-etching the conductive layer to be included inward a region of the land section, wherein the land section includes a first section which is in contact with the underlayer, and a second section which is not in contact with the underlayer.

A method of manufacturing a semiconductor device according to a seventh aspect of the present invention includes:

(a) forming an underlayer over a substrate;

(b) forming a flattening layer in a region around the underlayer;

(c) forming an interconnect layer which includes a linear section and a land section connected with the linear section so that the land section includes a first section and a second section, the first section being in contact with the underlayer and the second section being not in contact with the underlayer; and (d) mounting a semiconductor chip on the substrate, an integrated circuit being formed in the semiconductor chip.

A method of manufacturing a semiconductor device according to an eighth aspect of the present invention includes:

(a) forming an underlayer over a semiconductor substrate in which an integrated circuit is formed;

(b) forming a flattening layer in a region around the underlayer; and (c) forming an interconnect layer which includes a linear section and a land section connected with the linear section so that the land section includes a first section and a second section, the first section being in contact with the underlayer and the second section being not in contact with the underlayer.

DETAILED DESCRIPTION OF THE EMBODIMENT

Figure 1:
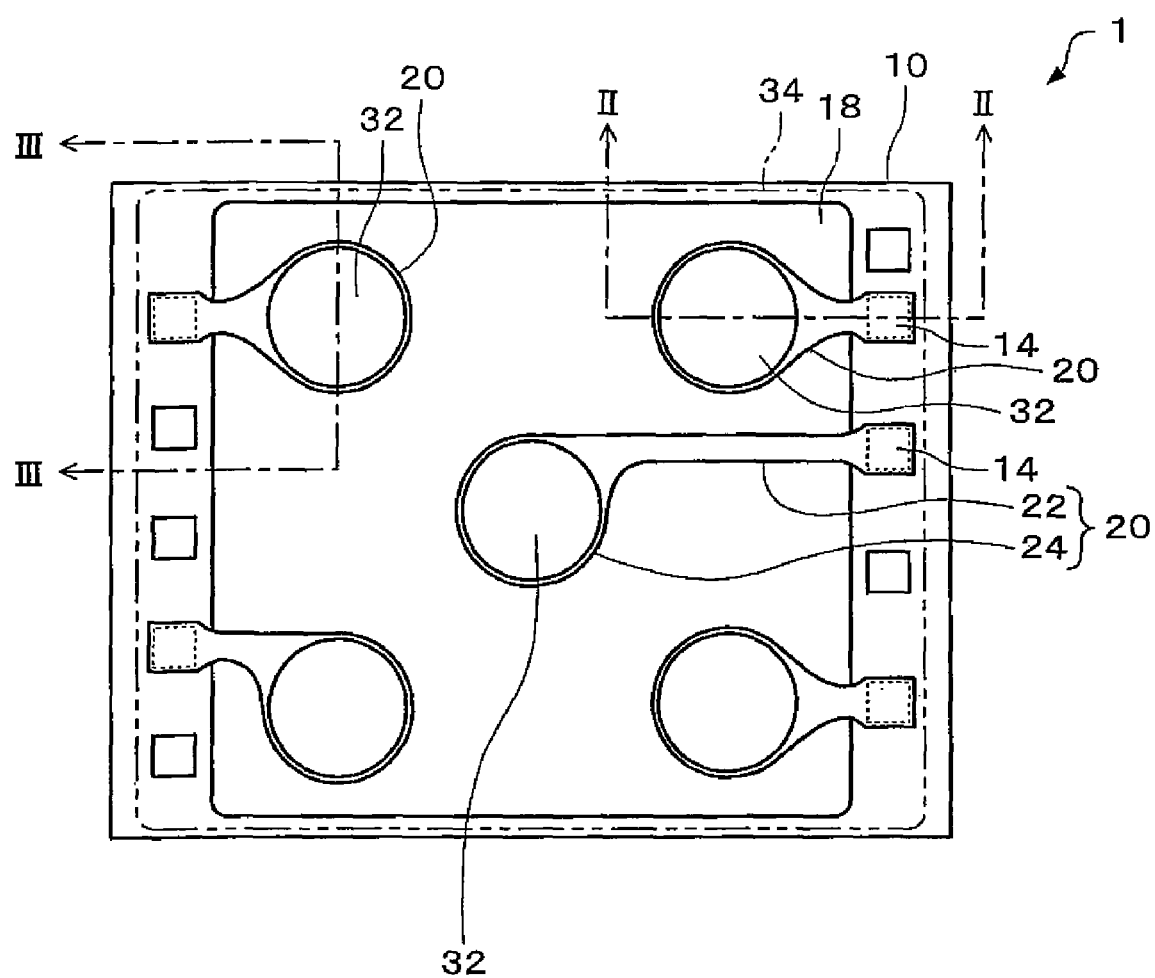
FIG. 1 shows a semiconductor device according to a first embodiment of the present invention.

Embodiments of the present invention may effectively reduce stress applied to an interconnect layer or an external terminal in a semiconductor device and a method of manufacturing the same, a circuit board, and an electronic instrument.

(1) A semiconductor device according to an embodiment of the present invention includes:

a semiconductor chip in which an integrated circuit is formed;

a substrate on which the semiconductor chip is mounted;

an interconnect layer which includes a linear section and a land section connected with the linear section; and an underlayer disposed under the interconnect layer, wherein the land section includes a first section which is in contact with the underlayer, and a second section which is not in contact with the underlayer.

According to this embodiment of the present invention, the second section of the land section is not in contact with the underlayer. Specifically, the underlayer is not formed right under the second section of the land section. Therefore, since the land section can be deformed or move so as follow stress applied from the outside, the stress can be effectively reduced.

(2) A semiconductor device according to an embodiment of the present invention includes:

a semiconductor substrate in which an integrated circuit is formed;

an interconnect layer which includes a linear section and a land section connected with the linear section; and an underlayer disposed under the interconnect layer, wherein the land section includes a first section which is in contact with the underlayer, and a second section which is not in contact with the underlayer.

According to this embodiment of the present invention, the second section of the land section is not in contact with the underlayer. Specifically, the underlayer is not formed right under the second section of the land section. Therefore, since the land section can be deformed or move so as follow stress applied from the outside, the stress can be effectively reduced.

(3) Any of these semiconductor devices may further include a resin layer formed on the semiconductor substrate, the land section may be formed over the resin layer with the underlayer interposed, and a space may exist between the second section of the land section and the resin layer.

The stress applied to the land section can be reduced by the resin layer.

(4) Any of these semiconductor devices may further include an insulating layer which covers the linear section and includes an opening which exposes a part of the land section.

(5) Any of these semiconductor devices may further include an insulating layer which covers the linear section and includes an opening which exposes a part of the land section, and the space between the resin layer and the second section of the land section may be filled with the insulating layer.

According to this semiconductor device, the flexibility of the land section are further increased in the case where the insulating layer is softer than the underlayer, whereby the stress can be reduced.

(6) With any of these semiconductor devices, a width of the first section of the land section may be smaller than a width of the part of the land section exposed from the insulating layer.

This allows the flexibility of the land section to be further increased against the stress applied to the exposed section of the land section, whereby the stress can be effectively reduced.

(7) Any of these semiconductor devices may further include an insulating layer which covers the linear section and includes an opening which exposes an entire part of the land section.

(8) With any of these semiconductor devices, the first section may be positioned at a center portion of the land and the second section may be positioned at an end portion of the land.

This enables the land section to incline at the center of its planar shape as an axis, whereby the stress applied to the land section can be reduced.

(9) With any of these semiconductor devices, a planar shape of the first section of the land section may be formed to be longer in a direction in which the linear section extends.

This enables the land section to easily incline at the extension of the linear section as an axis. Therefore, breakage of the connection section between the linear section and the land section can be prevented.

(10) With any of these semiconductor devices, the underlayer may be formed under only the land section.

(11) With any of these semiconductor devices, the underlayer may be formed under the linear section and the land section.

(12) With any of these semiconductor devices, a thickness of the underlayer may be greater than a thickness of the interconnect layer.

This enables the space right under the second section of the land section to be increased, whereby the flexibility of the land section are further increased.

(13) Any of these semiconductor devices may further include an external terminal formed on the land section.

This increases the flexibility of the external terminal. As a result, the flexibility of the land section and the external terminal are further increased against the stress applied to the base section of the external terminal, whereby the stress can be effectively reduced.

(14) A circuit board according to an embodiment of the present invention has one of the above semiconductor devices mounted thereon.

(15) An electronic instrument according to an embodiment of present invention has one of the above semiconductor devices.

(16) A method of manufacturing a semiconductor device according to an embodiment of the present invention includes:

(a) forming a conductive layer over a substrate;

(b) forming an interconnect layer which includes a linear section and a land section connected with the linear section so that the conductive layer is disposed under at least the land section;

(c) forming an underlayer by over-etching the conductive layer to be included inward a region of the land section; and (d) mounting a semiconductor chip on the substrate, an integrated circuit being formed in the semiconductor chip, wherein the land section includes a first section which is in contact with the underlayer, and a second section which is not in contact with the underlayer According to this embodiment of the present invention, the second section of the land section is not in contact with the underlayer. Specifically, the underlayer is not formed right under the second section of the land section. Therefore, since the land section can be deformed or move so as follow stress applied from the outside, the stress can be effectively reduced.

(17) A method of manufacturing a semiconductor device according to an embodiment of the present invention includes:

(a) forming a conductive layer over a semiconductor substrate in which an integrated circuit is formed;

(b) forming an interconnect layer which includes a linear section and a land section connected with the linear section so that the conductive layer is disposed under at least the land section;

(c) forming an underlayer by over-etching the conductive layer to be included inward a region of the land section, wherein the land section includes a first section which is in contact with the underlayer, and a second section which is not in contact with the underlayer.

According to this embodiment of the present invention, the second section of the land section is not in contact with the underlayer. Specifically, the underlayer is not formed right under the second section of the land section. Therefore, since the land section can be deformed or move so as follow stress applied from the outside, the stress can be effectively reduced.

(18) A method of manufacturing a semiconductor device according to an embodiment of the present invention includes:

(a) forming an underlayer over a substrate;

(b) forming a flattening layer in a region around the underlayer;

(c) forming an interconnect layer which includes a linear section and a land section connected with the linear section so that the land section includes a first section and a second section, the first section being in contact with the underlayer and the second section being not in contact with the underlayer; and (d) mounting a semiconductor chip on the substrate, an integrated circuit being formed in the semiconductor chip.

According to this embodiment of the present invention, the second section of the land section is not in contact with the underlayer. Specifically, the underlayer is not formed right under the second section of the land section. Therefore, since the land section can be deformed or move so as follow stress applied from the outside, the stress can be effectively reduced.

(19) A method of manufacturing a semiconductor device according to an embodiment of the present invention includes:

(a) forming an underlayer over a semiconductor substrate in which an integrated circuit is formed;

(b) forming a flattening layer in a region around the underlayer; and (c) forming an interconnect layer which includes a linear section and a land section connected with the linear section so that the land section includes a first section and a second section, the first section being in contact with the underlayer and the second section being not in contact with the underlayer.

According to this embodiment of the present invention, the second section of the land section is not in contact with the underlayer. Specifically, the underlayer is not formed right under the second section of the land section. Therefore, since the land section can be deformed or move so as follow stress applied from the outside, the stress can be effectively reduced.

(20) Any of these methods of manufacturing a semiconductor device may further include removing the flattening layer after the step (c).

The embodiments of the present invention are described below with reference to the drawings.

First Embodiment

Figure 2:
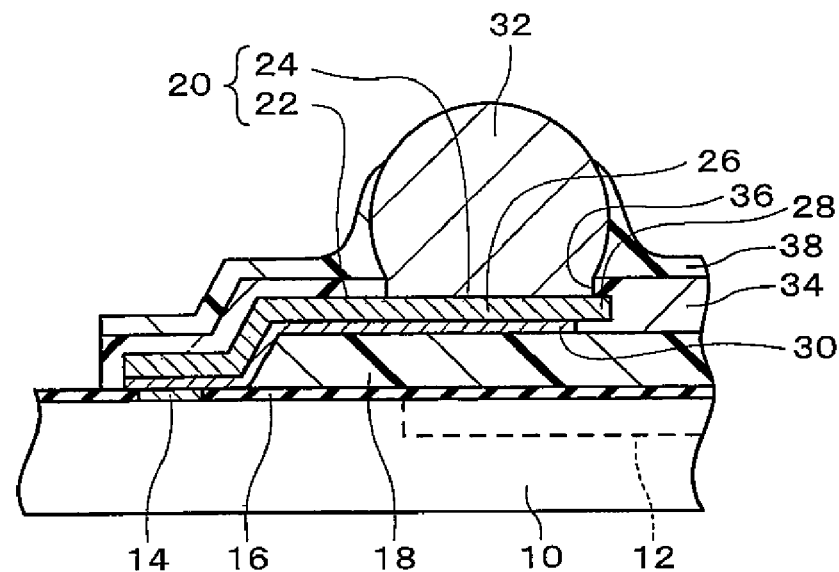
FIG. 2 is a cross-sectional view along the line II-II shown in FIG. 1.
Figure 3:
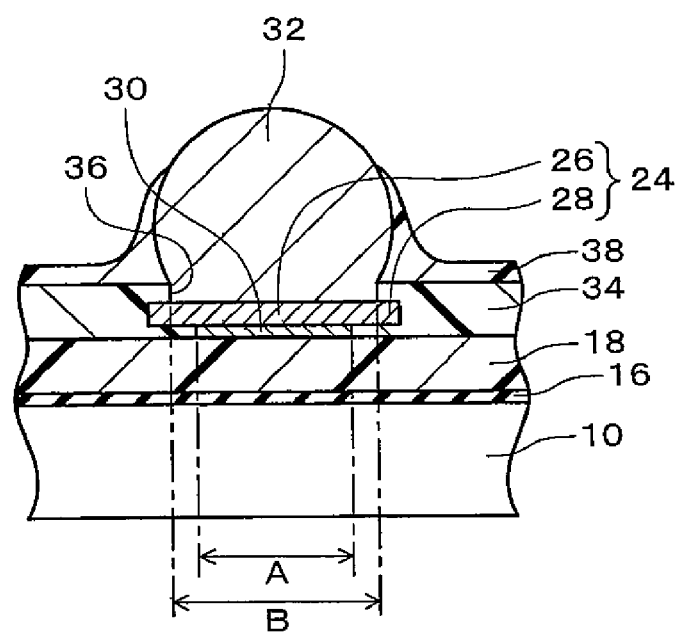
FIG. 3 is a cross-sectional view along the line III-III shown in FIG. 1.
Figure 4:
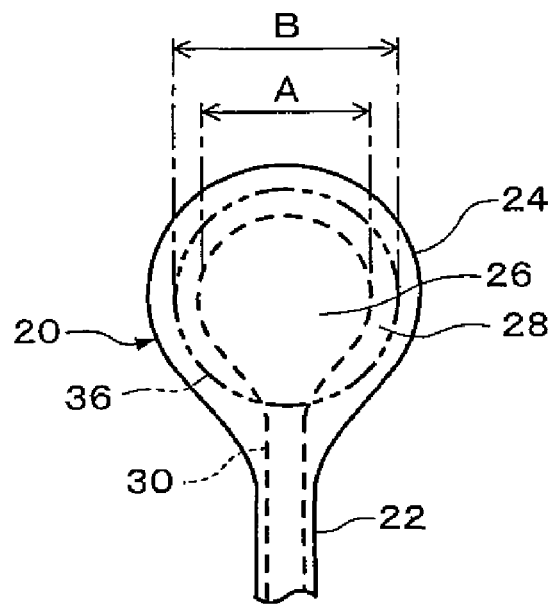
FIG. 4 is illustrative of a semiconductor device according to the first embodiment of the present invention.

FIGS. 1 to 9D are illustrative of a semiconductor device and a method of manufacturing the same according to a first embodiment of the present invention. FIG. 1 is a plan view in which a part of the semiconductor device (insulating layer 34, covering layer 38, and the like) is omitted. FIG. 2 is a cross-sectional view along the line II-II shown in FIG. 1. FIG. 3 is a cross-sectional view along the line III-III shown in FIG. 1. FIG. 4 is a plan view of an interconnect layer and an underlayer.

The semiconductor device according to the present embodiment includes a semiconductor substrate 10. The semiconductor substrate 10 may be a semiconductor chip as shown in FIG. 1, or may be a semiconductor wafer. As shown in FIG. 2, an integrated circuit 12 is formed in the semiconductor substrate 10, and a plurality of electrodes 14 (pads, for example) electrically connected with the integrated circuit 12 are formed on the semiconductor substrate 10. One integrated circuit 12 is formed in the semiconductor chip, and one group of the electrodes 14 is formed. A plurality of integrated circuits 12 are formed in the semiconductor wafer, and a plurality of groups of the electrodes 14 are formed. As shown in FIG. 1, the electrodes 14 may be arranged along the edges (two or four opposite sides, for example) of the semiconductor chip (region which becomes a semiconductor chip in the case of a semiconductor wafer). A passivation film 16 (SiN, $SiO_2$, or MgO, for example) is formed on the surface of the semiconductor substrate 10 (surface on which the electrodes 14 are formed).

At least one layer of a resin layer 18 is formed on the surface of the semiconductor substrate 10 on which the electrodes 14 are formed (passivation film 16, for example). The resin layer 18 is formed to avoid the electrodes 14. As shown in FIG. 1, the resin layer 18 may be formed in the range enclosed by the electrodes 14. The side surface of the resin layer 18 may be inclined so that the area of the surface (bottom) opposite to the upper surface is larger than the area of the upper surface. The resin layer 18 may have a stress relief function. The insulating layer 18 may be formed of a resin such as a polyimide resin, silicone-modified polyimide resin, epoxy resin, silicone-modified epoxy resin, benzocyclobutene (BCB), or polybenzoxazole (PBO).

The semiconductor device includes an interconnect layer 20. The interconnect layer 20 is formed on the semiconductor substrate 10 on the side of the electrode 14. The interconnect layer 20 is a conductive layer (copper (Cu) layer, for example), and is formed of a single layer or a plurality of layers. The interconnect layer 20 is electrically connected with the electrode 14. As shown in FIG. 2, the interconnect layer 20 may overlap the electrode 14. The interconnect layer 20 extends to reach the upper surface of the resin layer 18.

As shown in FIG. 1, the interconnect layer 20 includes a linear section 22 and a land section 24 connected with the linear section 22. The linear section 22 and the land section 24 are integrally formed. The linear section 22 extends from the electrode 14 to the land section 24. The linear section 22 may extend linearly or may be bent. The land section 24 is formed on the resin layer 18. The land section 24 is an electrical connection section. An external terminal 32 may be formed in the land section 24. The width of the land section 24 is greater than the width of the linear section 22. The planar shape of the land section 24 is generally circular. However, the planar shape of the land section 24 is not limited thereto. The width of the connection section between the linear section 22 and the land section 24 may be greater than the width of the linear section 22.

As shown in FIG. 2, the semiconductor device includes an underlayer 30 for the interconnect layer 20. The underlayer 30 is an under lay for the interconnect layer 20. The underlayer 30 is formed right under a part of the land section 24. The underlayer 30 may also be formed right under a part of the linear section 22 (region thinner than the linear section 22, for example) or the entirety of the linear section 22. The underlayer 30 may be a conductive layer, and is formed of a single layer or a plurality of layers. The underlayer 30 may include a barrier layer. The barrier layer prevents the interconnect layer 20 or a seed layer described later from diffusing into the resin layer 18 or the like. The barrier layer may be formed of titanium (Ti), chromium (Cr), nickel (Ni), titanium tungsten (TiW), or the like. In the case of forming the interconnect layer 20 by electroplating, the underlayer 30 may include a seed layer. The seed layer is formed on the barrier layer. The seed layer is formed of the same material as the material for the interconnect layer 20 (Cu, for example). The thickness of the underlayer 30 may be equal to or smaller than the thickness of the interconnect layer 20.

The semiconductor device may include the external terminal 32. The external terminal 32 is electrically connected with the interconnect layer 20. The external terminal 32 may be formed on the land section 24. The external terminal 32 is a formed of a conductive metal (alloy, for example) which is caused to melt and provides electrical connection (solder, for example). The external terminal 32 may be formed of soft solder or hard solder. The external terminal 32 may be in the shape of a sphere (solder ball, for example).

An insulating layer 34 (solder resist, for example) is formed on the semiconductor substrate 10. The insulating layer 34 covers a part of the interconnect layer 20. The entire interconnect layer 20 other than the area in which the external terminal 32 is formed may be covered with the insulating layer 34. This prevents occurrence of oxidation, corrosion, and electrical failure of the interconnect layer 20. The insulating layer 34 may be formed to avoid a part (center, for example) of the land section 24. Specifically, the insulating layer 34 may have an opening which exposes a part (center, for example) of the land section 24. The insulating layer 34 may cover a part of the end of the land section 24. As shown in FIG. 4, the planar shape of the opening 36 (planar shape of the exposed section of the land section 24) may be similar to the planar shape of the land section 24 (circular, for example). The external terminal 32 may be formed in the opening 36 (exposed section of the land section 24). The insulating layer 34 may cover the connection section between the linear section 22 and the land section 24. This prevents breakage of the connection section between the linear section 22 and the land section 24.

A covering layer 38 may be formed on the insulating layer 34. The covering layer 38 has insulating properties, and may be formed of a resin, for example. The covering layer 38 also covers the base section (bottom) of the external terminal 32. The covering layer 38 includes a section formed on the insulating layer 34, and a section which rises from the section formed on the insulating layer 34 and covers the base section of the external terminal 32. At least the base section of the external terminal 32 is reinforced by the covering layer 38. The covering layer 38 reduces stress applied to the external terminal 32 after the semiconductor device is mounted on a circuit board.

As shown in FIG. 3, the land section 24 includes a first section 26 which is in contact with the underlayer 30, and a second section 28 which is not in contact with the underlayer 30. Specifically, the first section 26 overlaps the underlayer 30, and the second section 28 does not overlap the underlayer 30. According to this configuration, since the underlayer 30 is not formed right under the second section 28 of the land section 24, the land section 24 can be deformed or move so as follow the stress, whereby the stress can be effectively reduced. The first section 26 may be disposed at the center of the land section 24, and the second section 28 may be disposed on the end of the land section 24. This enables the land section 24 to incline at the center of its planar shape as an axis, whereby the stress applied to the land section 24 can be reduced. In the case where the external terminal 32 is formed on the land section 24, the flexibility of the external terminal 32 are increased, whereby the stress applied to the base section of the external terminal 32 can be reduced. As shown in FIG. 4, the second section 28 may be disposed on the entire circumference of the first section 26 excluding the connection section between the linear section 22 and the land section 24. In this case, the second section 28 may be disposed on the entire circumference of the first section 26 so as to have an approximately uniform width (excluding the area near the connection section between the linear section 22 and the land section 24). In the case where the land section 24 is formed on the resin layer 18 through the underlayer 30, the second section 28 of the land section 24 is disposed at an interval from the resin layer 18. As shown in FIG. 3, the space between the second section 28 and the resin layer 18 may be filled with the insulating layer 34. According to this configuration, the flexibility of the land section 24 are further increased in the case where the insulating layer 34 is softer than the underlayer 30, whereby the stress can be reduced.

As shown in FIG. 3 or 4, it is preferable that the width A (maximum width, for example) of the planar shape of the first section 26 and the width B (maximum width, for example) of the planar shape of the exposed section of the land section 24 (planar shape of the opening 36) have the relationship expressed by A<B. This allows the underlayer 30 to be disposed inside the contact area between the land section 24 and the external terminal 32. Therefore, the flexibility of the land section 24 and the external terminal 32 are further increased against the stress applied to the exposed section of the land section 24 (stress applied to the base section of the external terminal 32), whereby the stress can be effectively reduced. The planar shape of the first section 26 may be similar to the planar shape of the land section 24 (circular, for example). The planar shape of the first section 26 may be similar to the planar shape of the opening 36 (circular, for example).

FIGS. 5 to 8 show modifications of the semiconductor device according to the present embodiment. FIGS. 5 to 8 are plan views of the interconnect layer and the underlayer. In the following modifications, the details described in the above embodiment are omitted.

Figure 5:
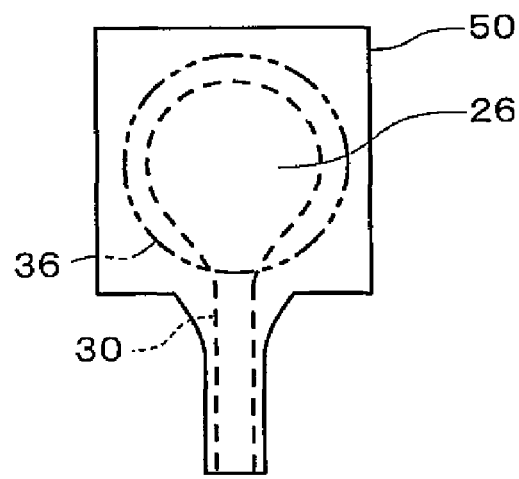
FIG. 5 is illustrative of a semiconductor device according to a modification of the first embodiment of the present invention.

As shown in the modification in FIG. 5, the planar shape of a land section 50 may be polygonal (quadrilateral, for example). In this case, the planar shape of the first section 26 with which the underlayer 30 is in contact may be similar to the planar shape of the opening 36 (circular, for example).

Figure 6:
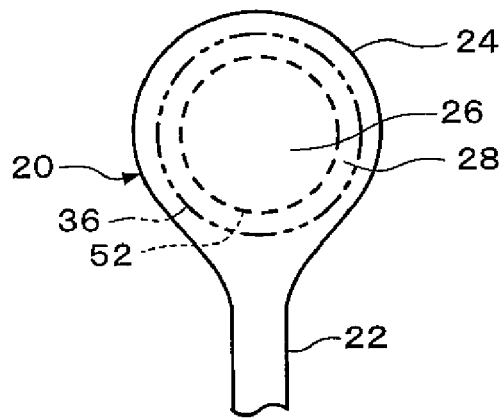
FIG. 6 is illustrative of a semiconductor device according to another modification of the first embodiment of the present invention.

As shown in the modification in FIG. 6, an underlayer 52 may be formed as an underlay for only the land section 24. The underlayer 52 may be formed only right under a part of the land section 24. In this modification, the underlayer 52 is not formed right under the linear section 22. The description of the underlayer 30 may be applied to other configurations of the underlayer 52. In the example shown in FIG. 6, the second section 28 is disposed on the entire circumference of the first section 26.

Figure 7:
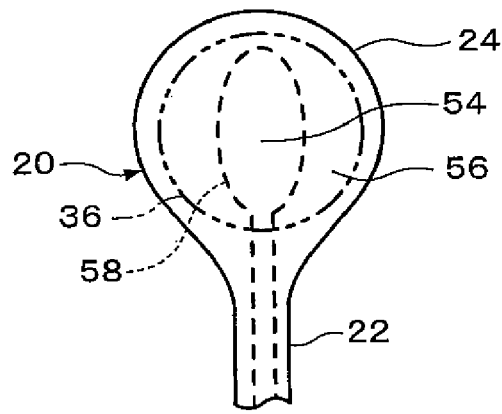
FIG. 7 is illustrative of a semiconductor device according to a further modification of the first embodiment of the present invention.
Figure 8:
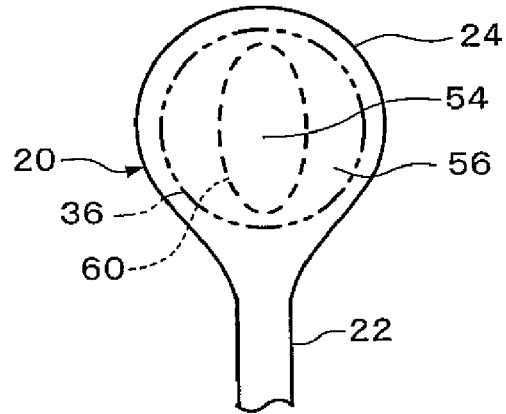
FIG. 8 is illustrative of a semiconductor device according to a still further modification of the first embodiment of the present invention.

As shown in FIG. 7 or 8, the planar shape of the first section 54 may be formed to be longer in the direction in which the linear section 22 extends. The planar shape of the first section 54 may be oval or rectangular. This enables the lateral width of the second section 56 (width in the widthwise direction of the linear section 22) to be greater than the vertical width (width in the direction in which the linear section 22 extends), whereby the land section 24 easily inclines at the extension of the linear section 22 as an axis. Therefore, breakage of the interconnect layer 20 (connection section between the linear section 22 and the land section 24 in more detail) can be prevented. As shown in FIG. 7, an underlayer 58 may also be formed right under a part of the linear section 22. As shown in FIG. 8, an underlayer 60 may be formed only right under a part of the land section 24.

The semiconductor device according to the present embodiment is configured as described above, and can effectively reduce the stress applied to the interconnect layer 20 or the external terminal 32. The details of the effects are as described above.

Figure 9A:
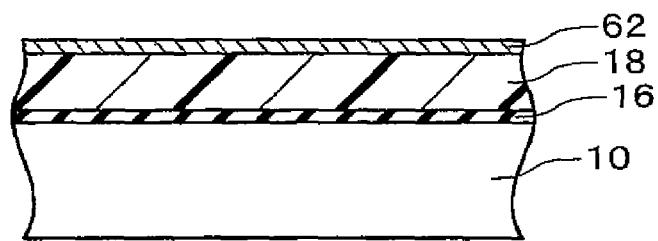
FIGS. 9A to 9D show a method of manufacturing a semiconductor device according to the first embodiment of the present invention.

A method of manufacturing the semiconductor device according to the present embodiment is described below. As shown in FIG. 9A, a conductive layer 62 is formed on the semiconductor substrate 10 in which the integrated circuit (see FIG. 2) is formed and on which the passivation film 16 is formed. The conductive layer 62 may be formed on the side of the semiconductor substrate 10 on which the electrode (see FIG. 2) is formed. The conductive layer 62 may be formed to be electrically connected with the electrode (to overlap the electrode). The resin layer 18 may be formed on the semiconductor substrate 10 (passivation film 16), and the conductive layer 62 may be formed in the entire region of the resin layer 18 and the passivation film 16. The conductive layer 62 may be formed by sputtering, plating (electroplating or electroless plating), or a combination of these. The conductive layer 62 may be formed by using an inkjet method or a printing method. The conductive layer 62 becomes the underlayer 30 for the interconnect layer 20 (see FIG. 9D).

Figure 9B:
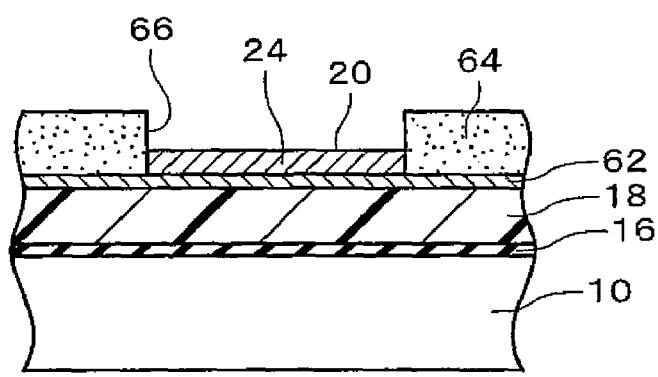
Figure 9C:
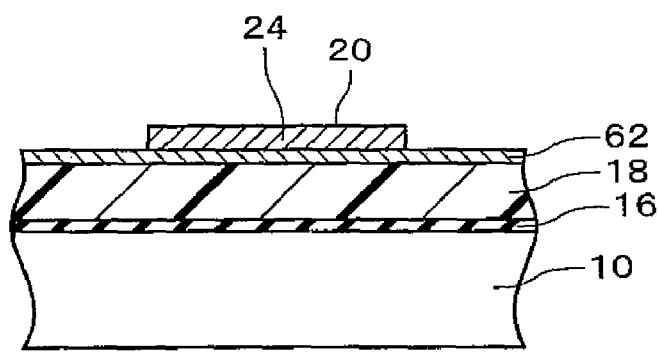

As shown in FIG. 9B, the interconnect layer 20 is formed. The interconnect layer 20 may be formed by applying lithographic technology. For example, a resist 64 may be patterned to have an opening 66, and the interconnect layer 20 may be formed on the conductive layer 62 in the area exposed in the opening 66. The interconnect layer 20 may be formed by plating (electroplating, for example). The interconnect layer 20 may be formed by electroplating using the conductive layer 62 as a feed layer. The interconnect layer 20 is formed by patterning so as to include the linear section 22 (see FIG. 2) and the land section 24. The linear section and the land section 24 (specifically, the entire interconnect layer 20) may be formed on the conductive layer 62 as an underlay. In the case of electroplating the interconnect layer 20, the conductive layer 62 is disposed right under the entire land section 24. In the case where the resist 64 is formed, the resist 64 is removed as shown in FIG. 9C. The interconnect layer 20 is thus formed on the conductive layer 62. The interconnect layer 20 may be formed by applying an ink-jet method or a printing method differing from the above example. The interconnect layer 20 is formed so that at least the land section 24 is formed on the conductive layer 62 as an underlay.

Figure 9D:
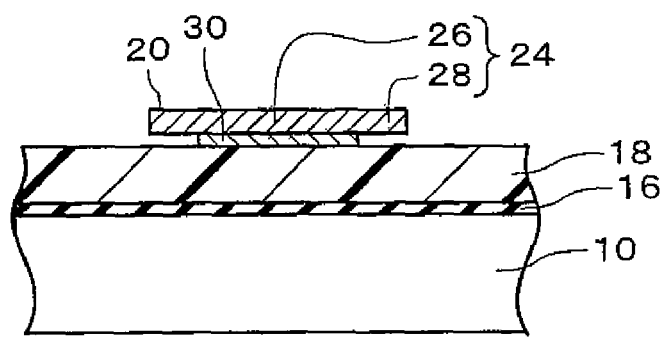

As shown in FIG. 9D, the conductive layer 62 is over-etched inward the region of the land section 24 to form the underlayer 30. Specifically, the amount of etching is controlled (by time, example) so that the etchant enters inside the region of the land section 24. The underlayer 30 may be formed by wet etching. A surfactant (soap, for example) may be mixed with the etchant (etching solution, for example) so that the etchant easily enters the space between the land section 24 and the resin layer 18 (or passivation film 16), as shown in FIG. 9D. The land section 24 which includes the first section 26, which is in contact with the underlayer 30, and the second section 28, which is not in contact with the underlayer 30, can be formed in this manner. As shown in FIG. 9D, the first section 26 may be disposed at the center of the land section 24, and the second section 28 may be disposed on the end of the land section 24. The area of the conductive layer 62 which becomes the underlay for the linear section may be over-etched as described above, or may be just etched along the region of the linear section. The insulating layer 34, the external terminal 32, and the covering layer 38 may be formed, if necessary (see FIG. 3).

The above-described steps may be performed for the semiconductor substrate 10 as a semiconductor wafer. In this case, the semiconductor substrate 10 is cut in units of the integrated circuits 12 after the above-described steps are completed. The semiconductor substrate 10 can be thus divided into a plurality of semiconductor devices, each including a semiconductor chip. According to this method, since packaging is performed in wafer units, productivity is increased. The details described for the above semiconductor device apply to other items of the method of manufacturing the semiconductor device according to the present embodiment.

Second Embodiment

Figure 10A:
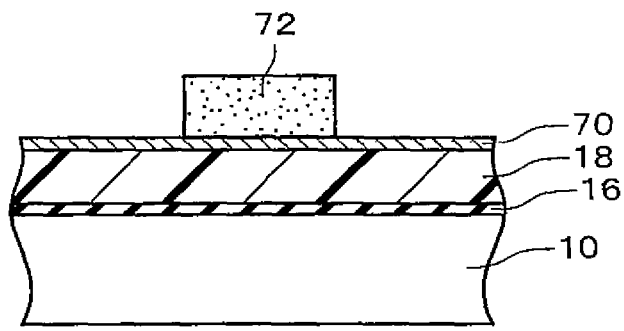
FIGS. 10A to 10D show a method of manufacturing a semiconductor device according to a second embodiment of the present invention.
Figure 10B:
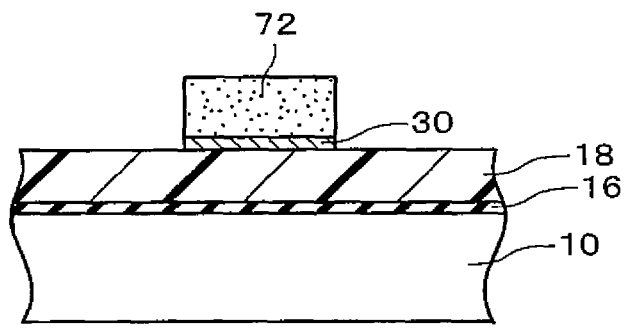
Figure 10C:
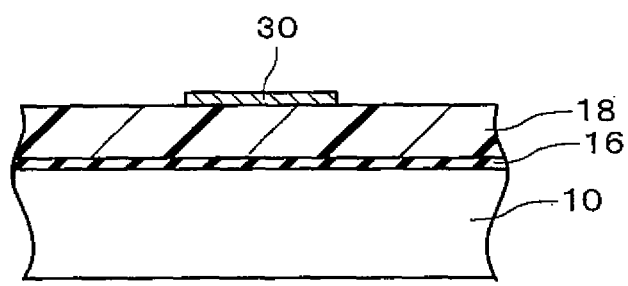
Figure 10D:
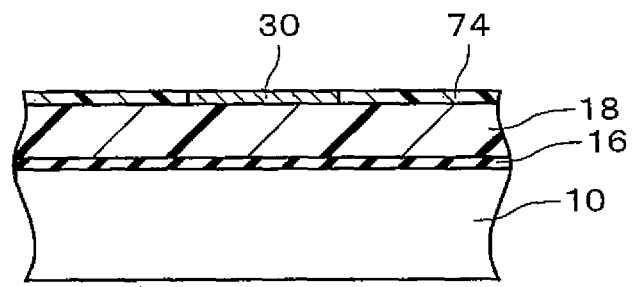
Figure 11A:
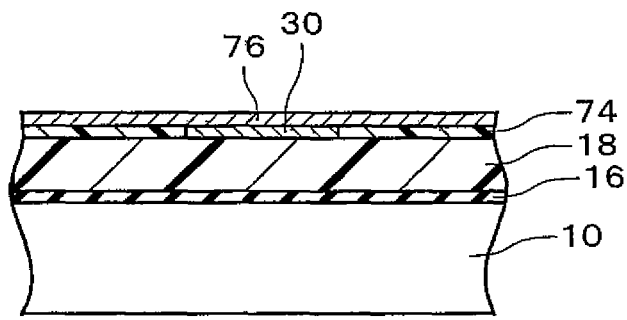
FIGS. 11A to 11D show the method of manufacturing the semiconductor device according to the second embodiment of the present invention.
Figure 11B:
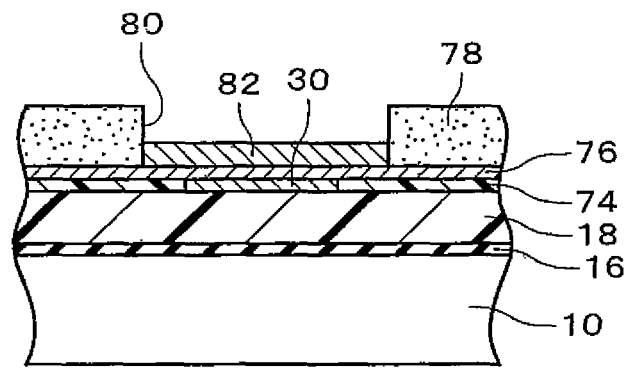
Figure 11C:
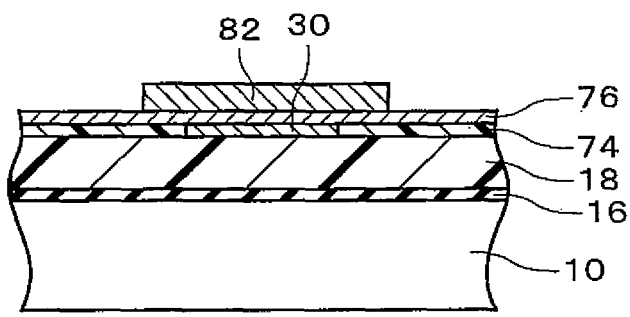
Figure 11D:
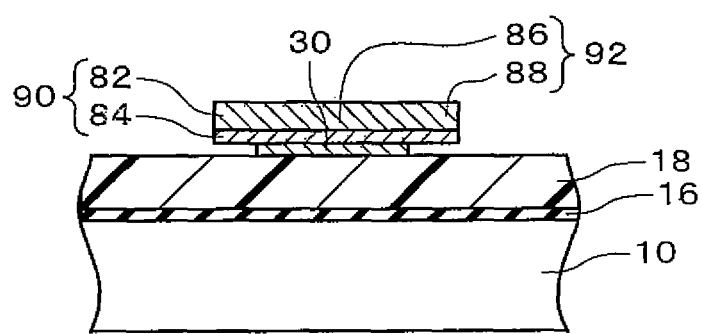
Figure 12A:
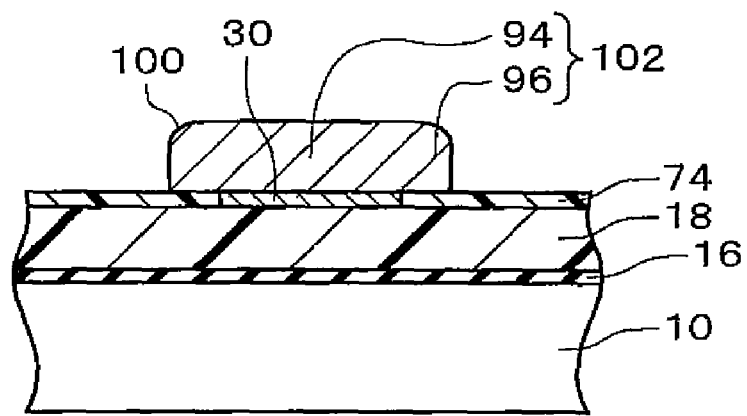
FIGS. 12A and 12B show a modification of the method of manufacturing the semiconductor device according to the second embodiment of the present invention.
Figure 12B:
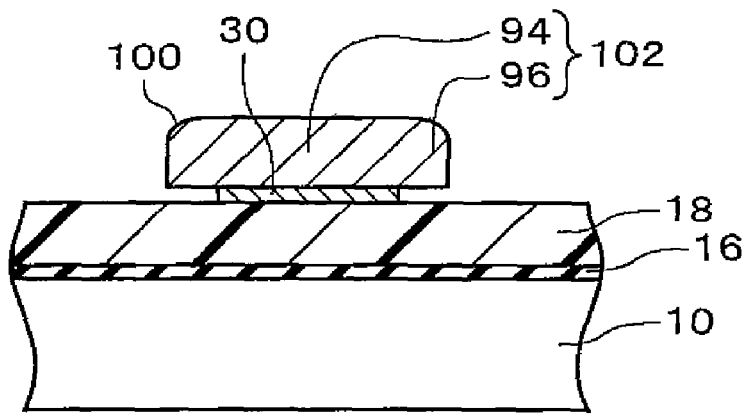

FIGS. 10A to 11D show a method of manufacturing a semiconductor device according to the second embodiment of the present invention, and FIGS. 12A and 12B show a modification of the method of manufacturing a semiconductor device.

The underlayer 30 is formed on the semiconductor substrate 10 (see FIG. 10C). For example, a conductive layer 70 is formed on the side of the semiconductor substrate 10 on which the electrode is formed as shown in FIG. 10A, and a part of the conductive layer 70 is removed by etching (dry etching or wet etching, for example) as shown in FIG. 10B. A part of the conductive layer 70 may be covered with a resist 72 by applying lithographic technology, and the remaining area of the conductive layer 70 may be removed. The resist 72 is then removed, and the underlayer 30 is formed as shown in FIG. 10C. The description of the conductive layer 62 in the first embodiment may be applied to the formation method for the conductive layer 70.

As shown in FIG. 10D, a flattening layer 74 is formed in the region around the underlayer 30 except a region of the underlayer 30. The peripheral region may be a region which encloses the underlayer 30. The flattening layer 74 may be caused to adhere to the outer wall surface of the underlayer 30. A level difference between the underlayer 30 and the peripheral region can be eliminated (or reduced) by forming the flattening layer 74, whereby an interconnect layer 90 can be easily formed.

The interconnect layer 90 is then formed (see FIG. 11D). As shown in FIG. 11A, a first conductive layer 76 is formed. The first conductive layer 76 is a feed layer for forming a second conductive layer 82 described later by electroplating. The details of the conductive layer 62 described in the first embodiment may be applied to the details of the first conductive layer 76.

As shown in FIG. 11B, the second conductive layer 82 is formed on the first conductive layer 76. For example, a resist 78 may be patterned so as to have an opening 80 by applying lithographic technology, and the second conductive layer 82 may be formed on the first conductive layer 76 in the area exposed in the opening 80. The details of the second interconnect layer 20 described in the first embodiment may be applied to the details of the second conductive layer 82.

The resist 78 is removed as shown in FIG. 11C, and an unnecessary area of the first conductive layer 76 is removed by etching. The first conductive layer 76 may be patterned so as to have a planar shape the same as the planar shape of the second conductive layer 82 patterned in the previous step.

A multilayer interconnect layer 90 consisting of the first and second conductive layers 82 and 84 can be formed in this manner as shown in FIG. 11D. The interconnect layer 90 includes a linear section and a land section 92 connected with the linear section. The land section 92 includes a first section 86 which is in contact with the underlayer 30, and a second section 88 which is not in contact with the underlayer 30. As shown in FIG. 11D, the flattening layer 74 may be removed. In this case, the flattening layer 74 may be removed in the area present between the second section 88 and the resin layer 18. Another material (insulating layer 34 (see FIG. 3), for example) may be formed in the space between the second section 88 and the resin layer 18. As a modification, the flattening layer 74 may be allowed to remain. The flattening layer 74 may be allowed to remain at least in the space between the second section 88 and the resin layer 18. In this case, the flattening layer 74 is preferably formed of a material softer than the material for the underlayer 30. According to this configuration, the flexibility of the land section 92 or the external terminal formed on the land section 92 are increased by the flattening layer 74, whereby the stress can be reduced. The flattening layer 74 may be formed of a resin (the same material as the resin layer 18, for example), and preferably has a stress relief function.

As shown in the modification in FIGS. 12A and 12B, an interconnect layer 110 is formed after forming the flattening layer 74 in the region around the underlayer 30 except a region of the underlayer 30 (see FIG. 10D). In this modification, the interconnect layer 100 is formed by electroless plating (electroless copper plating, for example). As shown in FIG. 12A, the interconnect layer 100 having a mushroom-shaped cross section may be formed without forming a resist (mask). A resist (mask) may be formed, and the interconnect layer 100 having a straight-wall cross section along the inner wall of the opening of the resist may be formed. The interconnect layer 100 includes a linear section and a land section 102 connected with the linear section. The land section 102 includes a first section 94 which is in contact with the underlayer 30, and a second section 96 which is not in contact with the underlayer 30. The flattening layer 74 may be removed as shown in FIG. 12B, or may be allowed to remain. The above-described details may be applied to other details.

Third Embodiment

Figure 13:
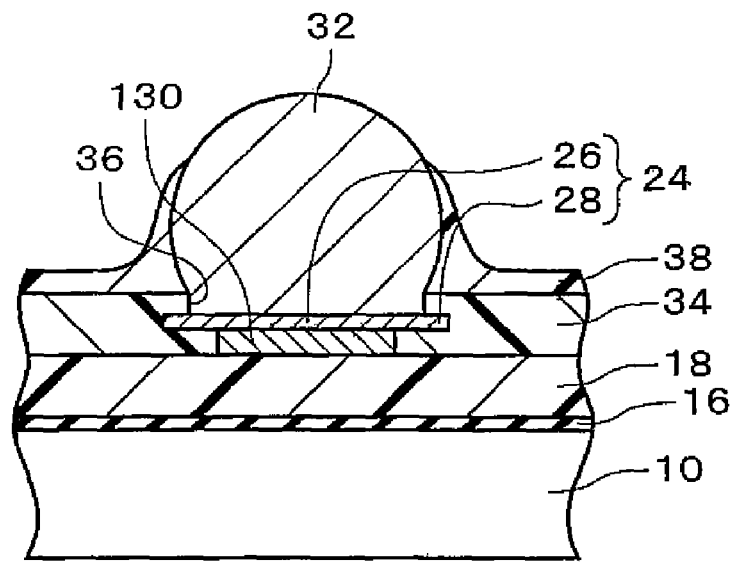
FIG. 13 shows a semiconductor device according to a third embodiment of the present invention.

FIG. 13 shows a semiconductor device according to the third embodiment of the present invention. In the present embodiment, an underlayer 130 is formed instead of the underlayer 30. The thickness of the underlayer 130 is greater than the thickness of the interconnect layer (land section 24, for example). The underlayer 130 may be formed by electroless plating (electroless nickel plating, for example). This enables a thick layer to be easily formed in comparison with the case of forming the underlayer by sputtering. The underlayer 130 may be formed to a thickness greater than the interconnect layer by electroless plating a thin film formed by sputtering. According to the present embodiment, since the space right under the second section 28 of the land section 24 (space between the second section 28 and the resin layer 18, for example) can be increased, the flexibility of the land section 24 or the external terminal 32 are further increased, whereby the stress can be effectively reduced. The above-described details may be applied to other details.

Fourth Embodiment

Figure 14:
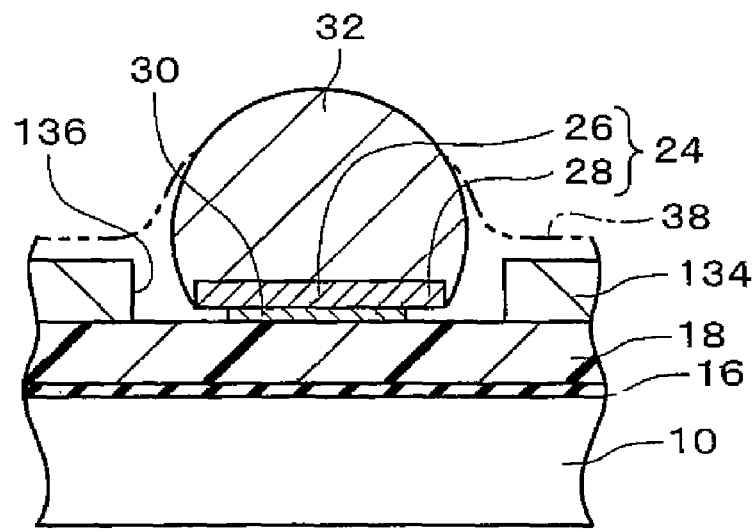
FIG. 14 shows a semiconductor device according to a fourth embodiment of the present invention.

FIG. 14 shows a semiconductor device according to the fourth embodiment of the present invention. In the present embodiment, an insulating layer 134 is formed instead of the insulating layer 34. The insulating layer 134 is formed to avoid the entire land section 24. Specifically, the insulating layer 134 includes an opening 136 which exposes the entire land section 24. The planar shape of the opening 136 may be similar to the planar shape of the land section 24 (circular, for example). The external terminal 32 may be formed inside the opening 136 so as to be in contact with the entire land section 24. In the present embodiment since the underlayer 30 is not formed right under the second section 28 of the land section 24, stress can be effectively reduced. In the case where the covering layer 38 is formed, the space between the second section 28 and the resin layer 18 may be filled with the covering layer 38. The covering layer 38 may be formed of a material softer than the material for the underlayer 30. The above-described details may be applied to other details.

Fifth Embodiment

Figure 15:
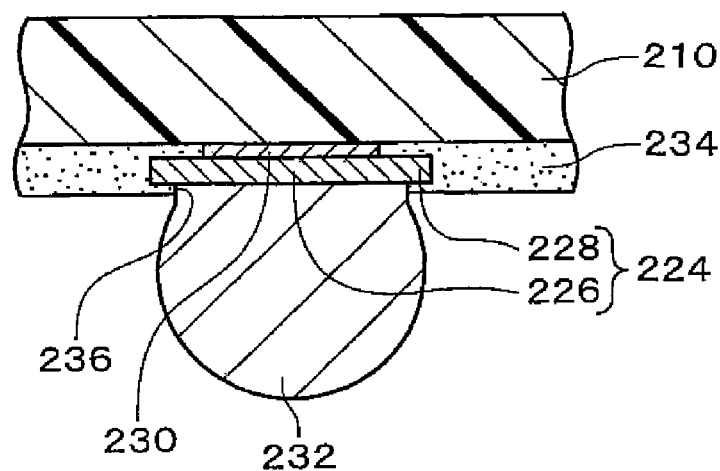
FIG. 15 shows a semiconductor device according to a fifth embodiment of the present invention.
Figure 16:
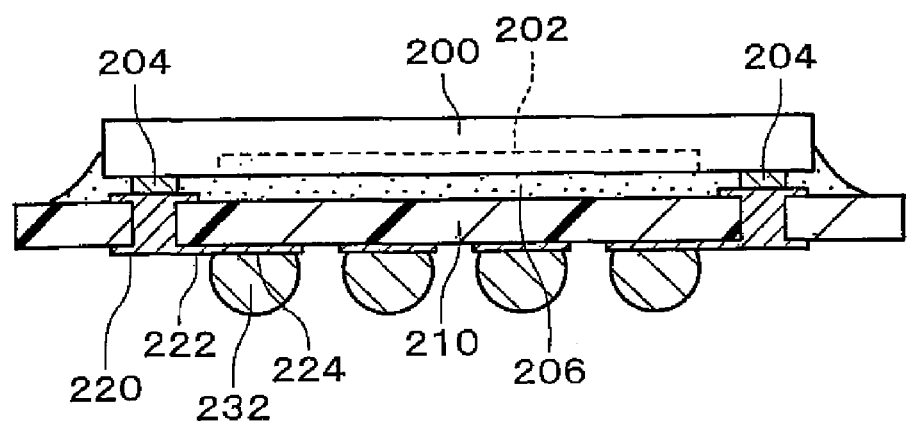
FIG. 16 shows the semiconductor device according to the fifth embodiment of the present invention.

FIGS. 15 and 16 show a semiconductor device according to the fifth embodiment of the present invention. FIG. 15 is a partial enlarged view of the semiconductor device shown in FIG. 16. The semiconductor device according to the present embodiment includes a semiconductor chip 200, a substrate 210 on which the semiconductor chip 200 is mounted, an interconnect layer 220 formed on the substrate 210 (interposer, for example), and an underlayer 230 for the interconnect layer 220.

An integrated circuit 202 is formed in the semiconductor chip 200, and a plurality of electrodes 204 electrically connected with the integrated circuit 202 are formed on the semiconductor chip 200. The electrode 204 may include a pad and a bump formed on the pad. The semiconductor chip 200 may be bonded face down to the substrate 210, or bonded face up to the substrate 210. In the case where the semiconductor chip 200 is bonded face down to the substrate 210, the space between the semiconductor chip 200 and the substrate 210 is filled with an underfill material 206 (resin in many cases). The interconnect layer 220 may be formed on each side of the substrate 210. In this case, the interconnect layer 220 includes a through-hole for providing electrical connection between each side of the substrate 210. The interconnect layer 220 is electrically connected with the integrated circuit 202 after the semiconductor chip 200 is mounted.

The interconnect layer 220 includes a linear section 222 and a land section 224 connected with the linear section 222. The land section 224 may be disposed on the side of the substrate 210 opposite to the semiconductor chip 200. An external terminal 232 may be formed on the interconnect layer 220 (land section 224, for example). An underlayer 230 of the interconnect layer 220 may be formed on the surface of the substrate 210. The underlayer 230 may be formed by forming a conductive layer and the interconnect layer 220 on the substrate 210, and over-etching the conductive layer inward the region of the land section 224 (see FIGS. 9A to 9D). The underlayer 230 may be formed on the substrate 210, a flattening layer (not shown) may be formed in the region around the underlayer 230, and the interconnect layer 220 may be formed on the underlayer 230 and the flattening layer. The flattening layer may be removed or allowed to remain. An insulating layer 234 which covers a part of the interconnect layer 220 may be formed on the substrate 210. In the example shown in FIG. 15, the insulating layer 234 includes an opening 236 which exposes a part (center, for example) of the land section 224. The above-described details may be applied to the interconnect layer 220, the underlayer 230, and the insulating layer 234.

As shown in FIG. 15, the land section 224 includes a first section 226 which is in contact with the underlayer 230, and a second section 228 which is not in contact with the underlayer 230. In the present embodiment, since the underlayer 230 is not formed right under the second section 228 of the land section 224, the land section 224 can be deformed or move so as follow the stress, whereby the stress can be effectively reduced. The above-described details (details described in the first to fourth embodiments (including the modification)) may be applied to other details.

Figure 17:
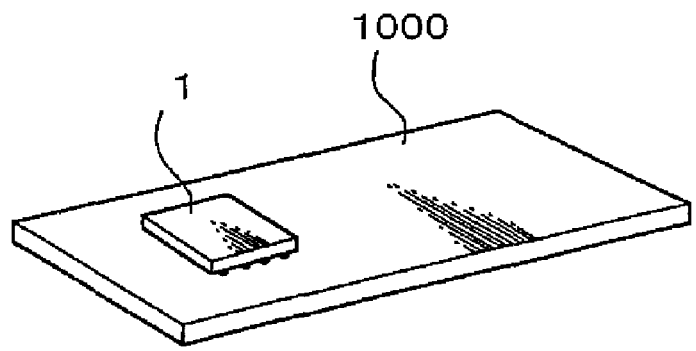
FIG. 17 shows a circuit board according to a sixth embodiment of the present invention.
Figure 18:
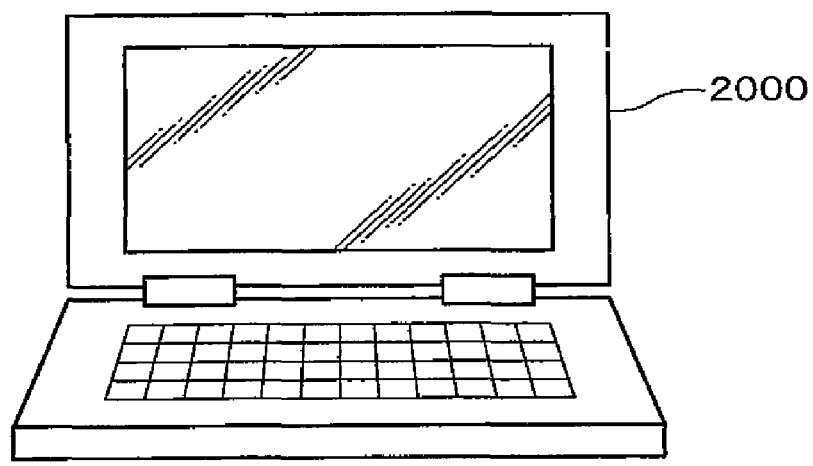
FIG. 18 shows an electronic instrument according to a seventh embodiment of the present invention.
Figure 19:
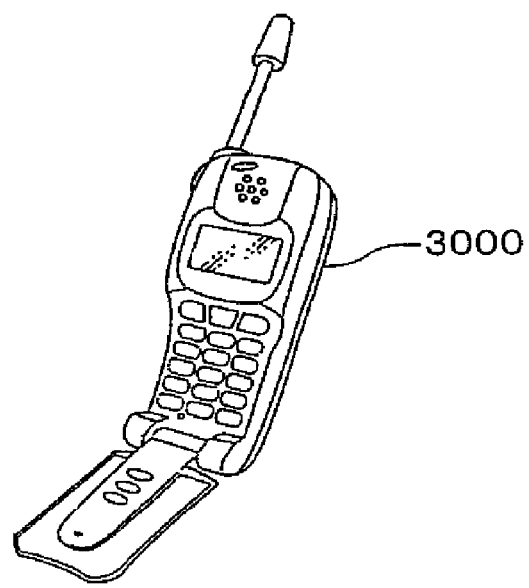
FIG. 19 shows an electronic instrument according to an eighth embodiment of the present invention.

FIG. 17 shows a circuit board 1000 on which a semiconductor device 1 according to a sixth embodiment of the present invention is mounted. FIGS. 18 and 19 respectively show a notebook-type personal computer 2000 and a portable telephone 3000 as examples of electronic instruments including the semiconductor device according to seventh and eighth embodiments of the present invention.

The present invention is not limited to the above-described embodiments. Various modifications and variations can be made. For example, the present invention includes configurations substantially the same as the configurations described in the embodiments (in function, in method and effect, or in objective and effect). The present invention also includes a configuration in which an unsubstantial portion in the above-described embodiments is replaced. The present invention also includes a configuration having the same effects as the configurations described in the embodiments, or a configuration capable of achieving the same objective. Further, the present invention includes a configuration in which a known technique is added to the configurations described in the embodiments.

What is claimed is:

1. A method of manufacturing a semiconductor device, comprising:
   (a) forming a passivation layer directly on a surface of a substrate having an electrode, the passivation layer having an opening that exposes a part of the electrode;
   (b) forming a resin layer on the passivation layer;
   (c) forming a conductive layer which is electrically connected to the electrode and formed to extend over the resin layer;
   (d) forming an interconnect layer which includes a linear section and a land section connected with the linear section so that the conductive layer is disposed under at least the land section, the land section is disposed above the resin layer;
   (e) forming an underlayer by over-etching the conductive layer to be included inward a region of the land section so that the land section includes a first section which is in contact with the underlayer and a second section which is not in contact with the underlayer;
   (f) forming an insulating layer covering a part of the interconnect layer so that the insulating layer has an opening positioned on a part of the land section;
   (g) forming an external electrode in the opening so that the external electrode is electrically connected to the interconnect layer; and
   (h) mounting a semiconductor chip on the substrate, an integrated circuit being formed in the semiconductor chip.

2. A method of manufacturing a semiconductor device, comprising:
   (a) forming a passivation layer directly on a surface of a semiconductor substrate in which an integrated circuit is formed, the semiconductor substrate having an electrode which is electrically connected to the integrated circuit, the passivation layer having an opening that exposes a part of the electrode;
   (b) forming a resin layer on the passivation layer;
   (c) forming a conductive layer which is electrically connected to the electrode and formed to extend over the resin layer;
   (d) forming an interconnect layer which includes a linear section and a land section connected with the linear section so that the conductive layer is disposed under at least the land section, the land section is disposed above the resin layer;
   (e) forming an underlayer by over-etching the conductive layer to be included inward a region of the land section so that the land section includes a first section which is in contact with the underlayer and a second section which is not in contact with the underlayer,
   (f) forming an insulating layer covering a part of the interconnect layer so that the insulating layer has an opening positioned on a part of the land section; and
   (g) forming an external electrode in the opening so that the external electrode is electrically connected to the interconnect layer.

3. A method of manufacturing a semiconductor device, comprising:
   (a) forming a resin layer over a substrate;
   (b) forming an underlayer on the resin layer so that a first surface of the underlayer faces the resin layer;
   (c) forming a flattening layer on the resin layer in a region around the underlayer so that a first surface of the flattening layer faces the resin layer, and a second surface of the flattening layer opposite to the first surface of the flattening layer is on the same plane as a second surface of the underlayer opposite to the first surface of the underlayer;

(d) forming an interconnect layer which includes a linear section and a land section connected with the linear section so that the land section includes a first section and a second section, the first section being in contact with the underlayer and the second section being not in contact with the underlayer; and (e) mounting a semiconductor chip on the substrate, an integrated circuit being formed in the semiconductor chip.

4. A method of manufacturing a semiconductor device, comprising:

(a) forming a resin layer over a semiconductor substrate in which an integrated circuit is formed;

(b) forming an underlayer on the resin layer so that a first surface of the underlayer faces the resin layer;

(c) forming a flattening layer on the resin layer in a region around the underlayer so that a first surface of the flattening layer faces the resin layer, and a second surface of the flattening layer opposite to the first surface of the flattening layer is on the same plane as a second surface of the underlayer opposite to the first surface of the underlayer; and (d) forming an interconnect layer which includes a linear section and a land section connected with the linear section so that the land section includes a first section and a second section, the first section being in contact with the underlayer and the second section being not in contact with the underlayer.

5. The method of manufacturing a semiconductor device as defined in claim 3, further comprising removing the flattening layer after the step (d).

6. The method of manufacturing a semiconductor device as defined in claim 4, further comprising removing the flattening layer after the step (d).

7. The method of manufacturing a semiconductor device as defined in claim 1, wherein a width of the opening of the insulating layer is larger than a width of the first section.

8. The method of manufacturing a semiconductor device as defined in claim 2, wherein a width of the opening of the insulating layer is larger than a width of the first section.

9. The method of manufacturing a semiconductor device as defined in claim 1, wherein the insulating layer is formed between the second section and the resin layer.

10. The method of manufacturing a semiconductor device as defined in claim 2, wherein the insulating layer is formed between the second section and the resin layer.

11. The method of manufacturing a semiconductor device as defined in claim 9, wherein the insulating layer is softer than the underlayer.

12. The method of manufacturing a semiconductor device as defined in claim 10, wherein the insulating layer is softer than the underlayer.

* * * * *